United States Patent
Goss et al.

(10) Patent No.: US 10,324,648 B1
(45) Date of Patent: Jun. 18, 2019

(54) WEAR-BASED ACCESS OPTIMIZATION

(71) Applicant: Seagate Technology LLC, Cupertino, CA (US)

(72) Inventors: Ryan James Goss, Prior Lake, MN (US); Antoine Khoueir, Edina, MN (US); Ara Patapoutian, Hopkinton, MA (US)

(73) Assignee: Seagate Technology LLC, Cupertino, CA (US)

( * ) Notice: Subject to any disclaimer, the term of this patent is extended or adjusted under 35 U.S.C. 154(b) by 19 days.

(21) Appl. No.: 15/495,036

(22) Filed: Apr. 24, 2017

Related U.S. Application Data

(60) Provisional application No. 62/329,120, filed on Apr. 28, 2016.

(51) Int. Cl.
*G06F 11/10* (2006.01)
*G06F 3/06* (2006.01)
*G11C 29/52* (2006.01)

(52) U.S. Cl.
CPC ............ *G06F 3/064* (2013.01); *G06F 3/0616* (2013.01); *G06F 3/0679* (2013.01); *G06F 11/1068* (2013.01); *G11C 29/52* (2013.01)

(58) Field of Classification Search
CPC .................................................. G06F 11/1076
USPC ........................................................ 714/764
See application file for complete search history.

(56) References Cited

U.S. PATENT DOCUMENTS

| | | | |
|---|---|---|---|
| 8,060,718 B2 * | 11/2011 | Freitas | G06F 12/0246 711/105 |
| 8,130,553 B2 | 3/2012 | Buch et al. | |
| 8,495,283 B2 | 7/2013 | Park et al. | |
| 8,732,389 B2 | 5/2014 | Feldman et al. | |
| 8,745,318 B2 | 6/2014 | Rub et al. | |
| 8,879,324 B2 | 11/2014 | Alhussien et al. | |
| 9,244,766 B2 | 1/2016 | Patapoutian et al. | |
| 9,274,712 B2 | 3/2016 | Feldman et al. | |
| 9,298,608 B2 | 3/2016 | Fitzpatrick et al. | |
| 2009/0300265 A1 * | 12/2009 | Vyssotski | G11C 16/349 711/100 |
| 2012/0096217 A1 * | 4/2012 | Son | G06F 12/0246 711/103 |
| 2013/0061101 A1 | 3/2013 | Fitzpatrick et al. | |
| 2013/0094288 A1 | 4/2013 | Patapoutian et al. | |

* cited by examiner

*Primary Examiner* — Fritz Alphonse
(74) *Attorney, Agent, or Firm* — Cesari & Reed, LLP; Kirk A. Cesari; Christian W. Best

(57) ABSTRACT

Systems and methods are disclosed for wear-based access optimization. An apparatus may comprise a circuit configured to perform a data access operation at a target location of a memory, and determine a wear value of the target location. The circuit may compare the wear value to global wear value of other locations of the drive, and adjust data access parameters for the target location based on the comparison.

20 Claims, 6 Drawing Sheets

US 10,324,648 B1

WEAR-BASED ACCESS OPTIMIZATION

CROSS REFERENCE TO RELATED APPLICATIONS

The present application claims priority to U.S. provisional patent application Ser. No. 62/329,120, filed Apr. 28, 2016, and entitled "Wear-Based Access Optimization", the content of which is hereby incorporated by reference in its entirety.

SUMMARY

In certain embodiments, an apparatus may comprise a circuit configured to perform a data access operation at a target location of a memory, and determine a wear value of the target location. The circuit may compare the wear value to a global wear value of other locations of the drive, and adjust data access parameters for the target location based on the comparison.

DETAILED DESCRIPTION

In the following detailed description of certain embodiments, reference is made to the accompanying drawings which form a part hereof, and in which are shown by way of illustration of example embodiments. It is also to be understood that features of the embodiments and examples herein can be combined, exchanged, or removed, other embodiments may be utilized or created, and structural changes may be made without departing from the scope of the present disclosure.

In accordance with various embodiments, the methods and functions described herein may be implemented as one or more software programs running on a computer processor or controller. Dedicated hardware implementations including, but not limited to, application specific integrated circuits, programmable logic arrays, and other hardware devices can likewise be constructed to implement the methods and functions described herein. Further, the methods described herein may be implemented as a computer readable storage medium or memory device including instructions that, when executed, cause a processor to perform the methods.

Figure 1:
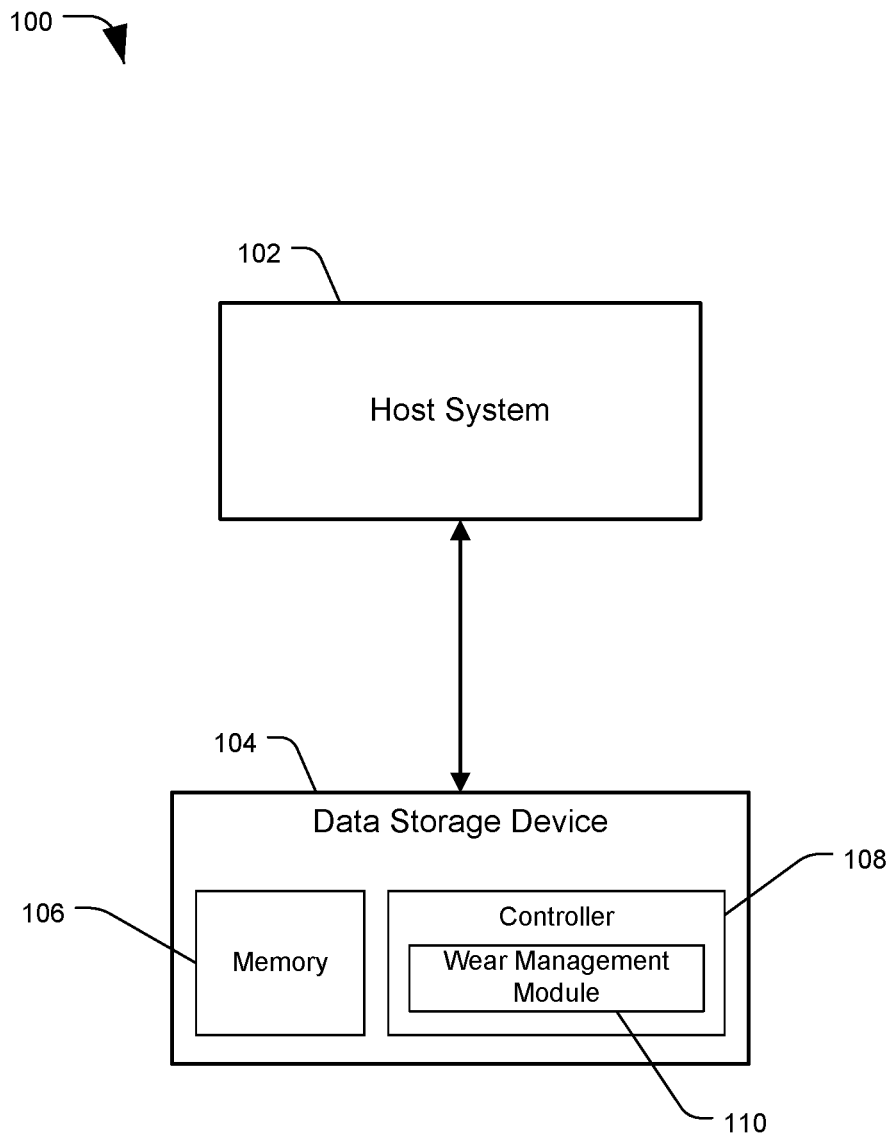
FIG. 1 is a diagram of a system configured to perform wear-based access optimization, in accordance with certain embodiments of the present disclosure.

FIG. 1 is a diagram of a system configured to perform wear-based access optimization, generally designated 100, in accordance with certain embodiments of the present disclosure. The system 100 may include a host 102 and a data storage device (DSD) 104. The host 102 may also be referred to as the host system or host computer. The host 102 can be a desktop computer, a laptop computer, a server, a tablet computer, a telephone, a music player, another electronic device, or any combination thereof. Similarly, the DSD 104 may be any of the above-listed devices, or any other device which may be used to store or retrieve data, such as a solid state drive (SSD). The host 102 and DSD 104 may be connected by way of a wired or wireless connection, or by a local area network (LAN) or wide area network (WAN). In some embodiments, the DSD 104 can be a stand-alone device not connected to a host 102 (e.g. a removable data storage device having its own case or housing), or the host 102 and DSD 104 may both be part of a single unit (e.g. a computer having an internal hard drive).

The DSD 104 may include a memory 106 and a controller 108. The DSD 104 may receive a data access request, such as a read or write request, from the host device 102. In response, the DSD 104 may use the controller 108 to perform data access operations on the memory 106 based on the request. The controller 108 may comprise a circuit or processor configured to control operations of the data storage device 104, such as the methods and functions described herein, as well as storing data to or retrieving data from the memory 106. The memory 106 may comprise one or more data storage mediums, such as nonvolatile solid state memories such as Flash memory, magnetic storage media such as disc drives, other types of memory, or a combination thereof.

Some memories 106 such as NAND flash memory have a limited life span based on a number of program and erase (P/E) operations performed at storage locations of the medium. As more P/E cycles are performed on storage blocks of the memory 106, those blocks may become less reliable and more error-prone. This degradation may be referred to as "wear". In order to mitigate problems related to wear, the DSD 104 may perform internal 'wear leveling' operations in order to keep the wear within certain bounds. These bounds may be rigidly defined and strictly enforced, with immediate action taken based on the rigid bounds. For example, after a certain number of program and erase cycles (globally across the drive or at a particular block), a drive may adjust error correction algorithms applied, or reorganize data to adjust wear. However, strict enforcement with immediate action can cause significant performance variation, such as in response times to host 102 commands.

DSD 104 may include a wear management module (WMM) 110. A "module" may be hardware, software, or both, configured to perform a particular task or job. For example, a module may include one or more physical components of a computing device (e.g., circuits, processors, etc.), may include instructions that, when executed, can cause a processor to perform a particular task or job, or any combination thereof. The WMM 110 may perform the methods and processes described herein to modify data access operations to the memory 106 based on determined wear. For example, the WMM 110 may determine a wear level across multiple storage locations of the memory 106, determine a wear level of a target location of a data access operation, compare the wear of the target location to the predetermined wear level, and adjust data access parameters for data access operations to the target location based on the comparison. The wear level or wear value of a location reflects the state of the memory. The state summarizes the capability of that location to reliably store data, its capability to quickly access stored data, or both. Wear value may be contrasted with a P/E counter for a location, which may simply represent a number of P/E operations performed at that location, but does not necessarily indicate the data storage reliability of the location. A more detailed example embodiment of a DSD 104 is described in regards to FIG. 2.

Figure 2:
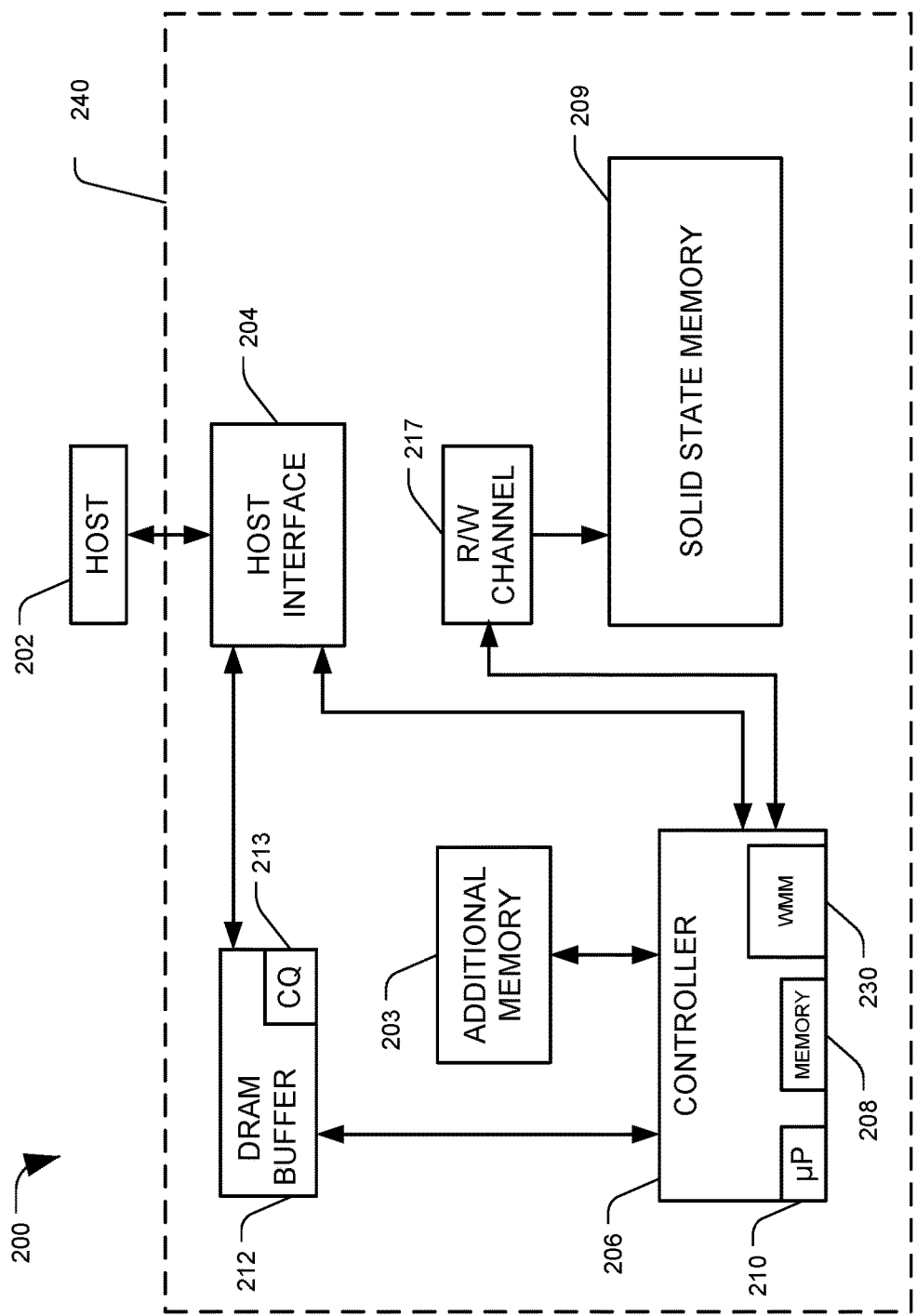
FIG. 2 is a diagram of a system configured to perform wear-based access optimization, in accordance with certain embodiments of the present disclosure.

FIG. 2 is a diagram of a system 200 configured to perform wear-based access optimization, in accordance with certain embodiments of the present disclosure. Specifically, FIG. 2 provides a functional block diagram of an example data storage device (DSD) 200. The DSD 200 can communicate with a host device 202 (such as the host system 102 shown in FIG. 1) via a hardware or firmware-based interface circuit 204. The interface 204 may comprise any interface that allows communication between a host 202 and a DSD 200, either wired or wireless, such as USB, IEEE 1394, Compact Flash, SATA, eSATA, PATA, SCSI, SAS, PCIe, Fibre Channel, Ethernet, or Thunderbolt, among others. The interface 204 may include a connector (not shown) that allows the DSD 200 to be physically removed from the host 202. In some embodiments, the DSD 200 may have a casing 240 housing the components of the DSD 200, or the components of the DSD 200 may be attached to the housing, or a combination thereof. The DSD 200 may communicate with the host 202 through the interface 204 over wired or wireless communication.

The buffer 212 can temporarily store data during read and write operations, and can include a command queue (CQ) 213 where multiple pending operations can be temporarily stored pending execution. Commands arriving over the interface 204 may automatically be received in the CQ 213 or may be stored there by controller 206, interface 204, or another component.

The DSD 200 can include a programmable controller 206, which can include associated memory 208 and processor 210. In some embodiments, the DSD 200 can include a read-write (R/W) channel 217, which can encode data during write operations and reconstruct user data retrieved from a memory, such as solid state memory 209, during read operations. Solid state memory 209 may include nonvolatile memory, such as NAND Flash memory.

In some embodiments, the DSD 200 may include an additional memory 203 instead of or in addition to solid state memory 209. For example, additional memory 203 can be either volatile memory such as DRAM or SRAM, non-volatile memory such as magnetic disc(s) or additional nonvolatile solid state memory, or any combination thereof. The additional memory 203 can function as a cache and store recently or frequently read or written data, or data likely to be read soon. Additional memory 203 may also function as main storage instead of or in addition to solid state memory 209. A DSD 200 containing multiple types of nonvolatile storage mediums, such as a disc and Flash, may be referred to as a hybrid storage device.

DSD 200 may include a wear management module (WMM) 230. The WMM 230 may perform operations to determine wear of memory locations of solid state memory 209, and may modify data access parameters employed by the controller 206, R/W channel 217, or other components when accessing memory locations of solid state memory 209. Additional details on the solid state memory 209 and WMM 230 are discussed in regard to FIG. 3.

Figure 3:
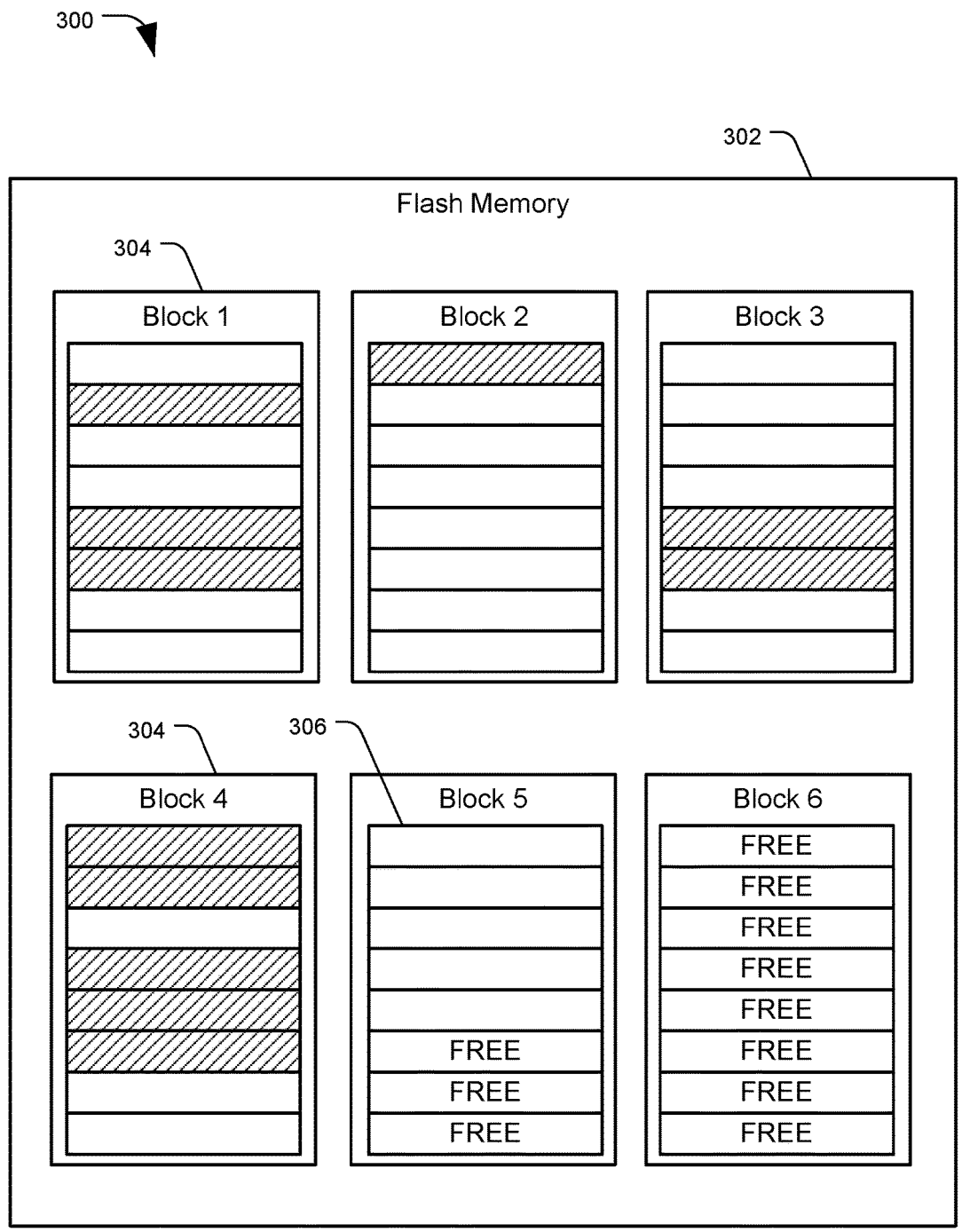
FIG. 3 is a diagram of a system configured to perform wear-based access optimization, in accordance with certain embodiments of the present disclosure.

FIG. 3 is a diagram of a system 300 configured to perform wear-based access optimization, in accordance with certain embodiments of the present disclosure. System 300 may include a Flash memory 302. For example, system 300 may include NAND Flash memory, although other types of solid state memory are also possible. Flash memory 302 may include a plurality of blocks 304, each of which may include a plurality of writable pages 306 for storing data. Data may be written to Flash memory 302 in page-sized data segments. For example, each page 306 may store 8 KiB (kibibyte) of data, and a block 304 may contain 64 pages, or 128 pages. A portion of each page may be devoted to error correction code (ECC) checksum values or other error correction or parity data. The size of pages and blocks, and the number of pages per block may be different depending on the device.

As stated, data may be written to Flash memory 302 one page 306 at a time, but already written data may not be overwritten with new data. If data stored in a specific page 306 is updated, the updated data may be written to a new location (e.g. a new page), and the old data becomes invalid. Pages containing invalid data are indicated in FIG. 3 by hashed lines. Once all the pages 306 in a block 304 have been filled with valid or invalid data, a garbage collection process may be performed to recapture space from invalid data and allow new data to be written to the block 304. In garbage collection, all valid data is read from a block 304 and written to new pages 306 in other blocks 304. Once all valid data has been removed from a block 304, the entire block 304 may be erased and made available for new data. Data may be written one page at a time, but only an entire block may be erased at a time. Various algorithms may be used to select which block or blocks to garbage collect, such as prioritizing blocks having the most invalid data.

For example, Block 4 may be selected for garbage collection, because it has the most invalid pages. Data from the three valid pages may be read, and may be copied to the three free pages of Block 5. Block 4 may therefore no longer have any valid data, and all pages 306 in Block 4 may be erased and made free for new data.

Figure 4:
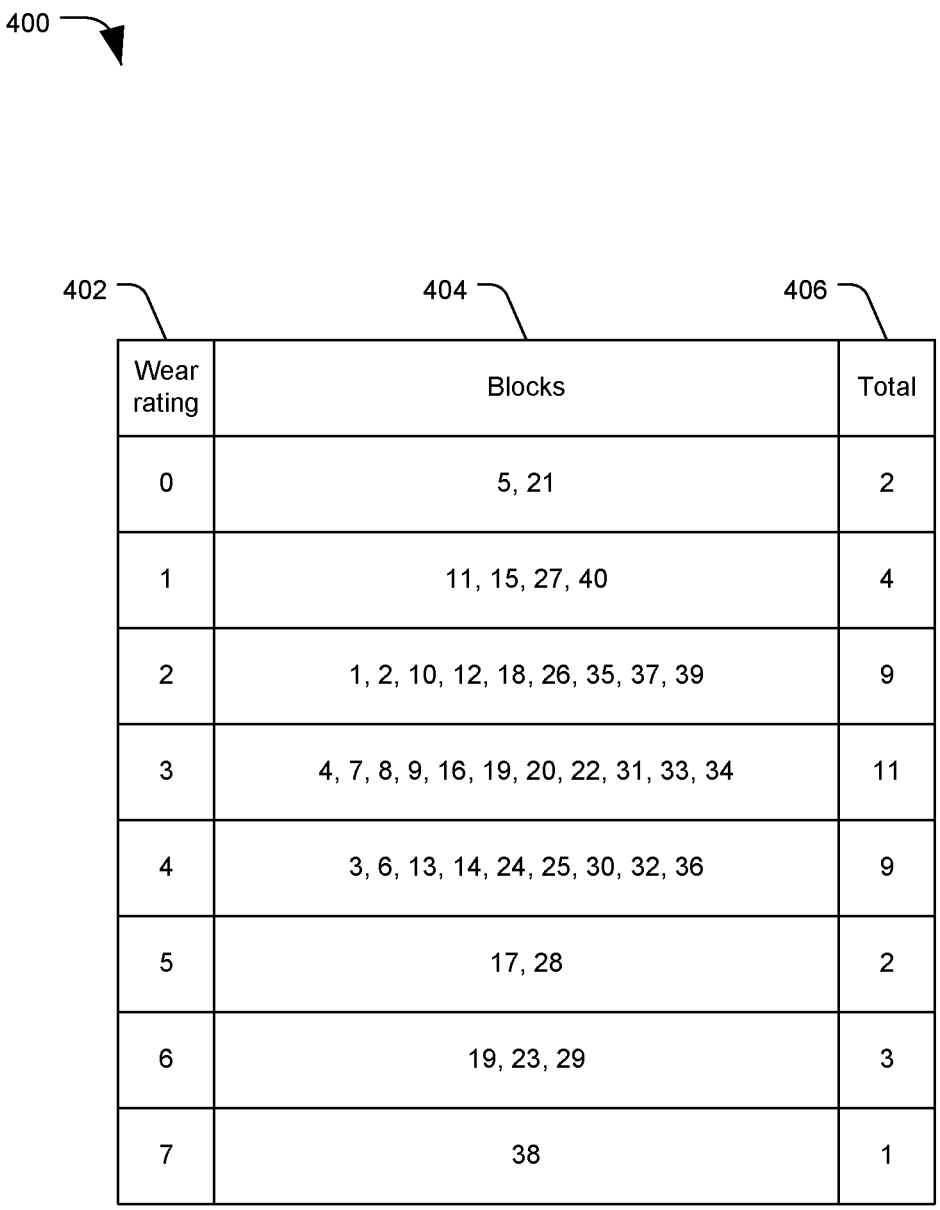
FIG. 4 depicts a table representing information for wear-based access optimization, in accordance with certain embodiments of the present disclosure.

Filling an entire block 304 and then clearing it through garbage collection may be referred to as a program erase (P/E or PE) cycle. PE cycles may produce wear on the blocks 304 and pages 306. The wear may manifest as a reduced reliability in retaining valid data in the cells of the block 304, in requiring modified voltages to read or write data, or in other ways. A device may track PE cycles as a general indication of wear on a Flash memory 302. However, different blocks 304, or even different pages 306 within a block 304, may be more or less susceptible to wear, and may withstand different numbers of PE cycles, depending on a device's efficiency in distributing PE cycles among all blocks 304. Accordingly, PE cycle count does not provide a direct indication of a storage location's reliability, and a device which only tracks PE cycles may not be able to efficiently manage wear due to not collecting actual wear information reflecting the reliability of various locations. A wear management module (WMM) may track wear information, including wear for individual locations, wear across the Flash memory 302, or both. The WMM may modify access parameters based on the wear information. FIG. 4 provides an example of wear management operations.

FIG. 4 is a diagram of a system configured to perform wear-based access optimization, in accordance with certain embodiments of the present disclosure. In particular, FIG. 4 may include a table 400 of data maintained or determined by a wear management module (WMM). The table 400 may include wear information for blocks or other storage locations of a solid state memory.

The WMM may determine information on a representative, average, typical, global, or expected wear of locations of the memory. The WMM may acquire the wear information based on actual testing of the memory locations in the drive. Wear may be determined based on information acquired while accessing the memory locations. For example, the wear of a location may be determined based on a measured bit error rate (BER), a number of iterations of iterative decoding required to successfully read data from the location, a number of re-read attempts, how many steps in an error recovery routine needed to be employed, via other metrics, or a combination thereof. These metrics may be acquired during host-initiated read commands to specific locations. A data storage device (DSD) including the WMM may also determine wear by performing a system scan or global wear scan of many or all data storage locations (e.g. blocks, pages, etc.) of a solid state memory. For example, the DSD may perform a system scan of each storage location on the drive by performing read operations at those locations. Optionally, the DSD may store a preset data pattern to empty blocks in order to read the data back and detect error metrics. A wear value for each location may be determined based on the metrics described above, such as a BER of the location detected during the read operation. The wear value may be a numerical value or wear classification (e.g. low wear, moderate wear, etc.) for the location determined based on the detected metrics.

Based on the detected metrics, a number of executed PE cycles, additional information, or a combination thereof, the WMM may classify individual locations into wear severity "buckets", ratings, categories, or classifications 402. For example, pages exhibiting a number of errors within a first value range may classified into a low wear or "wear rating 0" category, while pages exhibiting a number of errors from a higher value range may be classified into a second or "wear rating 1" category, etc. The WMM may generate a histogram or maintain a table or chart 400 to determine a number 406 of blocks 404 or other tested locations that fall into each wear rating category 402. The WMM may also maintain a listing of specific blocks 404 that are in each category 402, which listing may be used to make determinations of data access parameters to employ when accessing the corresponding block. Other methods can also be used to categorize and group locations according to wear, for example via clustering algorithms such as k-means clustering.

The WMM may also determine a representative wear level across locations of the solid state memory. A representative wear value for the DSD may be determined based on the wear value or metrics detected at each location. For example, the DSD may average the wear values, add up the wear values, or apply other techniques or algorithms for finding a representative wear across storage locations of the DSD. This representative wear value may be referred to herein as a global wear value, an average wear value, a typical wear value, an expected wear value, a predetermined wear value, or by other terminology.

For example, the WMM may add up (wear rating 402*total blocks for that rating 406) for each wear rating, and then divide the total by the total number of blocks 404 to obtain a representative wear rating across the blocks. The WMM could determine a total number of errors encountered during a memory scan divided by the number of scanned pages or other locations. The WMM may determine the median wear rating 402 across all blocks 404. Other methods may also be used to determine a global wear value. For example, an expected wear value may be set by a manufacturer based on extensive testing of solid state memory devices, such as by setting expected wear values corresponding to various PE cycle count thresholds. The WMM may check these manufacturer-set values without performing a scan of locations in the solid state memory. An example method of determining and employing wear information is described in regard to FIG. 5.

Figure 5:
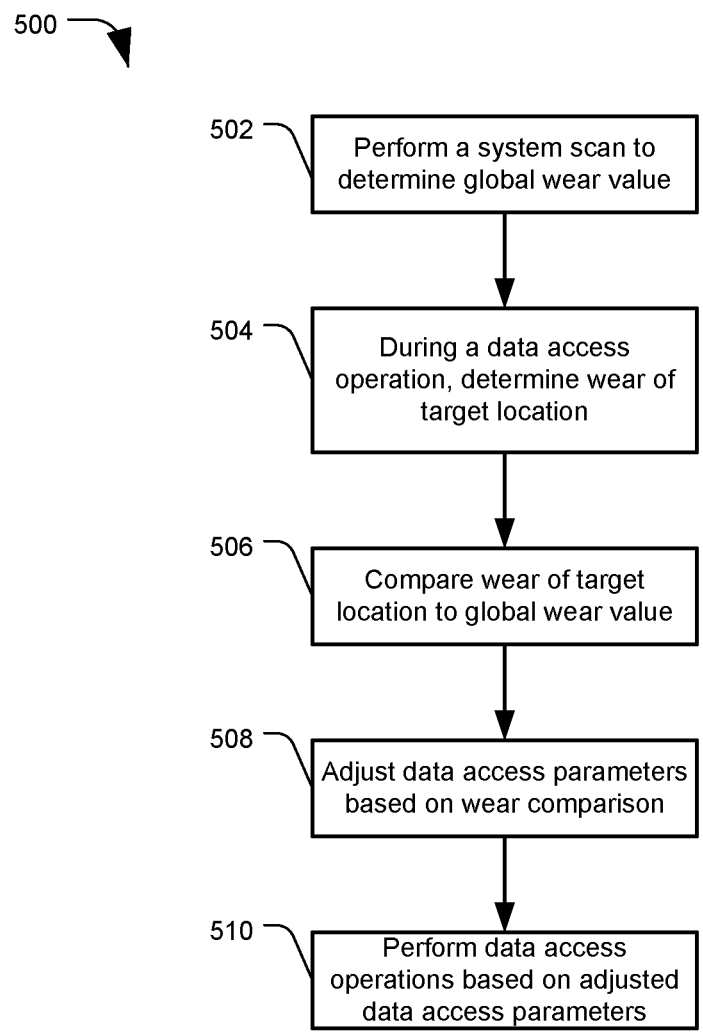
FIG. 5 is a flowchart of a method of wear-based access optimization, in accordance with certain embodiments of the present disclosure.

FIG. 5 is a flowchart of an example method 500 of wear-based access optimization, in accordance with certain embodiments of the present disclosure. The method 500 may be performed by a wear management module (WMM) as described herein.

The method 500 may include performing a system scan to determine a global wear value, at 502. For example, storage locations such as blocks or pages may be scanned for errors (e.g. via read operations) or other wear metrics. Wear levels of those locations may be determined based on the detected metrics, and a global wear value across multiple or all storage locations may be determined, as described herein. In some embodiments, typical or expected wear values may be pre-programmed, such as during a manufacturing process, based on PE cycle count thresholds. Other methods of determining average or expected wear values are also possible. The global wear value may be stored for use during later-performed data access operations, so the global value may be retrieved from a stored location when a data access operation is initiated.

During a data access operation, the method 500 may include determining a wear level of a target location for the data access operation, at 504. For example, during a read, program, or erase operation, a wear or wear rating for the target location may be retrieved from a table, such as table 400. Wear may also be determined while performing a read operation, or a read portion of a write-verify operation, by determining a number of errors, a BER, or other wear metric from the read location. The wear metrics may be used to update a wear rating for the target location in a wear table, such as table 400. Wear ratings may be retrieved from a table prior to performing a data access operation at a target location in order to determine data access parameters to employ during the operation, while wear information obtained during the operation may be used for future accesses to that location.

The wear information for the target location may be compared against the global wear value, at 506. For example, the method may include determining whether a wear value of the target location is higher or lower than the global wear value, or a threshold value N higher or lower than the global wear value. Wear metrics may also be compared, e.g. to determine whether the number of bit errors detected at the target location is N more than a global average of bit errors. The values of "N" may be set to identify outlier storage locations that exhibit significantly more or significantly less wear than typical locations. The global wear value may be based on the determination performed at 502. The wear of the target location and comparison to the global wear value may be performed prior to actually accessing the target memory location, in order to determine access parameters to employ when accessing the target location.

The wear rating for the target location itself, as well as the results of the comparison against the global wear value, may be used to adjust data access parameters for the target location, at 508. For example, during a read operation, the WMM may adjust a threshold voltage vT used to access the page, error recovery operations employed (e.g. vT shifting, number of retries, self-decoding, etc.), ICI (inter-cell interference) cancellation procedures to adjust vT, or other parameters. During program or erase operations, the WMM may adjust parameters such as program voltage, duration of program pulses, number of program pulses, number of iteration steps, maximum program time, or other parameters.

A device may have baseline or standard parameters it employs (for example, based on the determined average or typical wear), and the baseline parameters may be adjusted based on how the target location compares to a global wear value.

The comparison of target location wear to representative wear values may also be used to efficiently allocate resources. For example, ECC and XOR parity schemes can be used to correct data that has degraded or contains errors, but the information used for the correction algorithms may consume storage space. More errors can be corrected by adding additional error correction data, but there may be a finite limit on a number of errors that may be corrected or an amount of total storage capacity of a device that may be devoted to error correction data. For example, manufacturers may allocate a certain percentage of a drive to ECC data, and the drive may be limited to not exceed that percentage without compromising an advertised user storage capacity. Similarly, very worn pages may be retired if they are deemed unreliable, but this can also reduce the total storage capacity of a drive. Since taking these actions can be costly to drive capacity, device capability may be improved by employing them in a balanced way. If these techniques are employed to protect data on a first-come first-serve basis on a few pages exhibiting wear, there may be insufficient capacity to protect data on other pages. Instead, the WMM may use the wear information table or comparison to determine which pages or blocks are the worst and focus the error correction techniques on those. Similarly, pages or blocks exhibiting very little wear compared to the average or expected values may require much less ECC and redundancy protection. The wear information tracking and comparison allows a device to best fit the future ECC protection with what is predicted to be sufficient redundancy based upon the near term scanning. For example, when executing a program operation to a page that shows significantly more wear than the global wear value, the MWW may direct that much stronger ECC protection be applied for data written to that page. A block exhibiting lower wear than typical may have the error correction data reduced from the standard amount utilized by the device. Similarly, when performing a read operation, the drive may determine which ECC decoding algorithm to employ based on where the accessed page is located on the wear table relative to a global average. If the accessed page has significant wear compared to the global average, the drive may know to employ the most stringent ECC algorithm when decoding the data.

Figure 6:
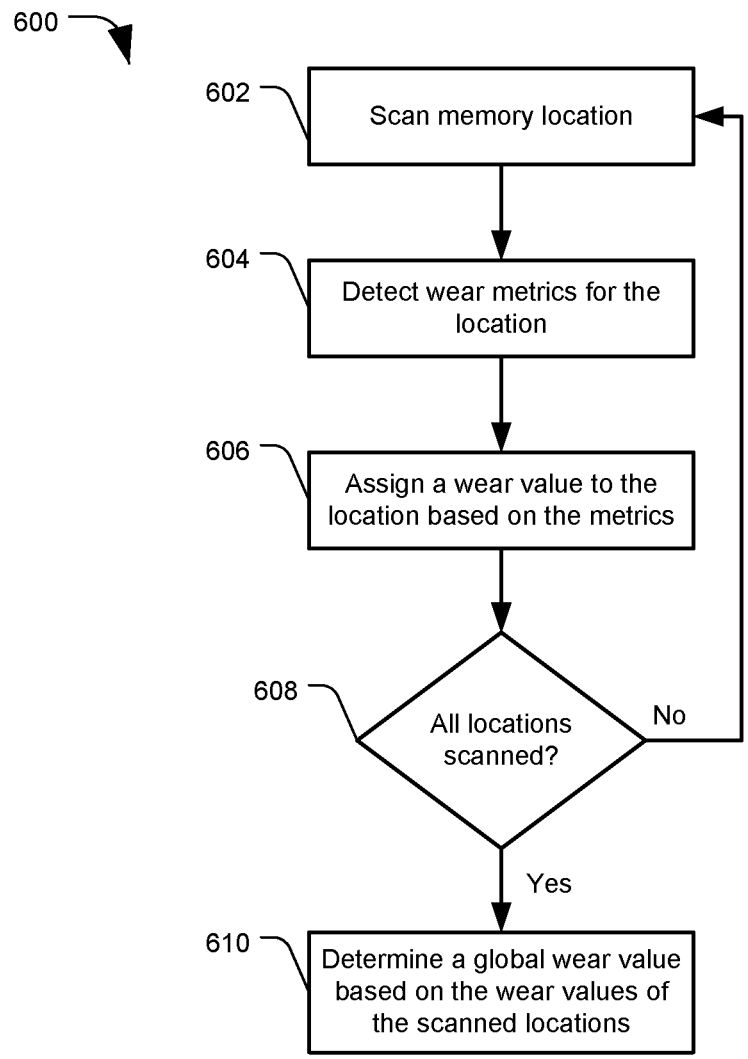
FIG. 6 is a flowchart of a method of wear-based access optimization, in accordance with certain embodiments of the present disclosure.

FIG. 6 is a flowchart of an example method 500 of wear-based access optimization, in accordance with certain embodiments of the present disclosure. Method 600 may include performing a system scan to determine a representative or global wear value for a data storage device (DSD), such as a nonvolatile NAND flash solid state drive. The method 600 may be performed by a wear management module (WMM) as described herein.

The method 600 may include scanning a memory location, at 602. The scan may be performed at various storage location granularities, such as by units of multiple blocks, by block, by page, or by other location increments. The scan may be performed for all locations of a given memory (e.g. all blocks of the DSD), or a subset of storage locations (e.g. all blocks of a particular flash memory die).

The method 600 may include detecting wear metrics for the location, at 604. The scan may include testing the location for wear metrics, such as by performing a read operation at the location and determining a number of errors, a bit error rate (BER), or other metrics that may indicate wear or degradation of a memory location. Based on the detected wear metrics, the method 600 may include assigning a wear value to the location based on the metrics, at 606. For example, wear metrics within certain value ranges may result in the storage location being assigned or categorized with a wear value. In some examples, indicators for storage locations (e.g. a page identifier) may be stored to a table or other data structure by clustering or "bucketizing" (e.g. sorted or categorized) according to wear value.

At 608, the method 600 may include determining whether all locations have been scanned. If not, the method 600 may include selecting a next location to scan, at 602. If all locations have been scanned, the method 600 may include determining a global wear value based on the wear values of the scanned locations, at 610. The global wear value may be a computed average of all wear values, a mean wear value, a value selected based on a total number of all wear metrics detected during the scan, based on other parameters or methods, or any combination thereof. Additional factors, such as a number of PE cycles executed by the DSD, may also be factored in when selecting a global wear value. The determined global wear value may be stored to a memory for use in adjusting data access parameters for future data access operations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Moreover, although specific embodiments have been illustrated and described herein, it should be appreciated that any subsequent arrangement designed to achieve the same or similar purpose may be substituted for the specific embodiments shown.

This disclosure is intended to cover any and all subsequent adaptations or variations of various embodiments. Combinations of the above embodiments, and other embodiments not specifically described herein, will be apparent to those of skill in the art upon reviewing the description. Additionally, the illustrations are merely representational and may not be drawn to scale. Certain proportions within the illustrations may be exaggerated, while other proportions may be reduced. Accordingly, the disclosure and the figures are to be regarded as illustrative and not restrictive.

What is claimed is:
1. An apparatus comprising:
  a circuit configured to:
    perform a global wear scan on a memory to determine a global wear value indicating a capability of locations of the memory to reliably store data;
    perform a data access operation at a target location of a memory;
    determine a wear value of the target location, the wear value of the target location indicating a capability of the target location to reliably store data;
    compare the wear value of the target location to the global wear value; and
    adjust data access parameters for the target location based on the comparison.

2. The apparatus of claim 1 further comprising the memory, including a solid state non-volatile storage medium.

3. The apparatus of claim 1, the circuit further configured to:
perform the global wear scan including:
scan memory locations of the memory to determine wear metrics for the memory locations, the memory locations including the target location;
assign wear values to the memory locations based on the wear metrics for each memory location; and
determine the global wear value based on the wear values of the memory locations.

4. The apparatus of claim 3 further comprising the wear metrics include a bit error rate (BER) of a memory location.

5. The apparatus of claim 3 further comprising the wear metrics are based on results of an error recovery operation performed to recover data from a memory location.

6. The apparatus of claim 3 comprising the global wear scan further including:
group the memory locations into wear severity categories based on the wear values of the memory locations; and
maintain a table associating the memory locations with their respective wear severity categories.

7. The apparatus of claim 6, the circuit further configured to:
update wear values for memory locations in the table based on wear metrics determined while performing host read operations on the memory locations.

8. The apparatus of claim 1 further comprising:
adjust the data access parameters for the target location, including modifying an error correction code (ECC) algorithm applied to the target location.

9. The apparatus of claim 8 further comprising:
determine a selected ECC algorithm from a plurality of ECC algorithms to apply to the target location based on an amount of storage capacity required for the selected ECC algorithm and a severity of the wear value of the target location relative to the global wear value.

10. The apparatus of claim 1 further comprising:
adjust the data access parameters for the target location including modifying a threshold voltage used to access data stored to the target location.

11. A method comprising:
performing a data access operation at a target location of a memory;
determining a wear value of the target location, the wear value of the target location indicating a capability of the target location to reliably store data;
comparing the wear value of the target location to a global wear value representative of wear across other locations of the memory; and
adjusting data access parameters for the target location based on the comparison.

12. The method of claim 11, further comprising:
performing a global wear scan, including:
scanning memory locations of the memory to determine wear metrics for the memory locations, the memory locations including the target location;
assigning wear values to the memory locations based on the wear metrics for each memory location; and
determining the global wear value based on the wear values of the memory locations.

13. The method of claim 12 further comprising:
performing an error recovery operation to recover data from at least one of the memory locations during the global wear scan; and
determining the wear metrics based on the error recovery operation.

14. The method of claim 12 comprising performing the global wear scan further including:
grouping the memory locations into wear severity categories based on the wear values of the memory locations; and
maintaining a table associating the memory locations with their respective wear severity categories.

15. The method of claim 11 further comprising:
determining the global wear value based on other wear values for the other locations of the memory determined during read operations to the other locations.

16. The method of claim 11 further comprising:
adjusting the data access parameters for the target location including:
determining a selected error correction code (ECC) algorithm from a plurality of ECC algorithms to apply to the target location based on an amount of storage capacity required for the selected ECC algorithm and a severity of the wear value of the target location relative to the global wear value; and
modifying the ECC algorithm applied to the target location to the selected ECC algorithm.

17. The method of claim 11 further comprising:
adjusting the data access parameters for the target location including modifying a threshold voltage used to access data stored to the target location.

18. An apparatus comprising:
a data storage device including:
a nonvolatile solid state memory;
an interface configured to communicate with a host device;
a circuit configured to:
receive a data access command from the host device directed to a target location of the nonvolatile solid state memory;
determine a wear value of the target location, the wear value of the target location indicating a capability of the target location to reliably store data;
compare the wear value of the target location to a global wear value representative of wear across other locations of the nonvolatile solid state memory;
adjust data access parameters for the target location based on the comparison; and
perform a data access operation to the target location based on the data access parameters.

19. The apparatus of claim 18, the circuit further configured to:
perform a global wear scan, including:
scan memory locations of the memory to determine wear metrics for the memory locations,
the memory locations including the target location,
the wear metrics based on errors encountered during read operations to the memory locations;
assign wear values to each memory location scanned based on the wear metrics for that memory location; and
determine the global wear value based on the wear values of the memory locations.

20. The apparatus of claim 19 comprising the global wear scan further including:
group the memory locations into wear severity categories based on the wear values of the memory locations; and maintain a table associating the memory locations with their respective wear severity categories.

* * * * *